United States Patent [19]
Anagnostopoulos

[11] Patent Number: 5,612,555
[45] Date of Patent: Mar. 18, 1997

[54] FULL FRAME SOLID-STATE IMAGE SENSOR WITH ALTERED ACCUMULATION POTENTIAL AND METHOD FOR FORMING SAME

[75] Inventor: Constantine N. Anagnostopoulos, Mendon, N.Y.

[73] Assignee: Eastman Kodak Company, Rochester, N.Y.

[21] Appl. No.: 408,370

[22] Filed: Mar. 22, 1995

[51] Int. Cl.$^6$ .................. H01L 27/148; H01L 29/768; H01L 29/792

[52] U.S. Cl. .................. 257/222; 257/221; 257/224; 257/231; 257/245; 257/324

[58] Field of Search .................. 257/222, 221, 257/231–233, 224, 245, 324

[56] References Cited

U.S. PATENT DOCUMENTS

| | | | |
|---|---|---|---|
| 3,402,081 | 9/1968 | Lehman | 148/188 |
| 3,654,499 | 4/1972 | Smith | 257/225 |
| 3,796,932 | 3/1974 | Amelio et al. | 257/221 |
| 3,895,966 | 7/1975 | MacDougall et al. | 148/1.5 |
| 3,912,545 | 10/1975 | Armstrong | 148/1.5 |
| 4,342,099 | 7/1982 | Kuo | 365/104 |
| 4,503,450 | 3/1985 | Brewer | 357/24 |
| 4,607,429 | 8/1986 | Kosonocky | 257/224 |
| 4,613,402 | 9/1986 | Losee et al. | 156/643 |
| 4,808,834 | 2/1989 | Kimata | 250/578 |
| 5,086,342 | 2/1992 | Spies et al. | 358/213 |
| 5,189,499 | 2/1993 | Izumi et al. | 257/222 |
| 5,241,198 | 8/1993 | Okada et al. | 257/215 |
| 5,262,661 | 11/1993 | Kuroda et al. | 257/227 |
| 5,521,405 | 5/1996 | Nakashiba | 257/221 |

OTHER PUBLICATIONS

Pan et al., "A Scaling Methodology for Oxide–Nitride–Oxide Interpoly Dielectric for EPROM Application," IEEE Transactions of Electron Devices, vol. 37, No. 6, Jun. 1990, pp. 1439–1443.

Primary Examiner—Gene M. Munson
Attorney, Agent, or Firm—James D. Leimbach

[57] ABSTRACT

In accordance with the invention, a full frame solid-state image sensor of altered accumulation potential comprises a substrate that includes a semiconductor of one conductivity type and has a surface at which is situated a photodetector that comprises a first storage area and a second storage area. The first and second storage areas each comprise a CCD channel of conductivity type opposite to the conductivity type of the semiconductor. A first barrier region separates the first storage area from the second storage area, and a second barrier region separates the second storage area from an adjacent photodetector; the second barrier region is shallower than the first barrier region. Adjacent to one side of the photodetector is a channel stop of the same conductivity type as the semiconductor. A first gate and a second gate each comprising a conductive layer overlie the CCD channel, and positioned between the channel and the conductive layer is an O—N—O dielectric that comprises a first silicon dioxide layer and a second silicon dioxide layer and a silicon nitride layer interposed between the silicon dioxide layers. The silicon nitride layer comprises a trapped electric charge sufficient to alter the accumulation potential by 3 to 4 volts; the trapped electric charge is injected into the silicon nitride layer by applying a stress potential to the first and second gates. Also in accordance with the invention, the silicon nitride layer may be heated simultaneously with the application of the stress potential to the gates.

11 Claims, 2 Drawing Sheets

FULL FRAME SOLID-STATE IMAGE SENSOR WITH ALTERED ACCUMULATION POTENTIAL AND METHOD FOR FORMING SAME

FIELD OF THE INVENTION

The present invention relates to a charge-coupled device (CCD) solid-state image sensor, and more particularly to a full frame CCD sensor of altered accumulation potential and a method for forming same.

BACKGROUND OF THE INVENTION

Solid-state image sensors in general comprise photodetector means for detecting radiation from an image and converting the radiation to charge carriers, and transfer means for carrying the charge carriers to an output circuit. In one type of solid-state image sensor, an interline area sensor, the CCD imager includes a plurality of photodetectors, or pixels, disposed in an array of rows and columns, with CCD shift registers arranged between the rows of the photodetectors. The photodetectors in each row are coupled by transfer gates to their adjacent CCD shift registers so that the charge carriers accumulated in the photodetectors can periodically be transferred to the CCD shift registers. In another type of sensor, a full frame sensor, a charge-coupled device (CCD) is employed as both photodetector and transfer means. A single CCD shift register at the bottom of the sensor transfers the charge carriers to an on-chip amplifier for read-out. Full frame sensors require a mechanical shutter.

In a full frame CCD sensor, a pixel typically comprises two phases, each phase being provided with a gate and each including a storage region and a barrier region. In a full frame imager, the minimum gate voltage typically required to be applied in the vertical clocks to cause majority carrier (hole) accumulation at the $Si/SiO_2$ interface in the storage regions of the pixels is between −6.5 and −7.5 volts; this voltage is referred to as the accumulation potential. Application of the accumulation potential to the gates of the sensor suppresses the dark current generated at the semiconductor-dielectric interface. Vertical clock voltages are therefore generally set to operate between −8 and +0.5 volts, this latter voltage being briefly applied to transfer charges between phases. Generation of a −8 volt clock voltage requires a −15 volt power supply.

PROBLEM TO BE SOLVED BY THE INVENTION

In a camera system, power supplies capable of providing −5 and +5 volts are required for the operation of the video amplifier. To simplify the power supply requirements, thereby reducing the cost of manufacturing a camera system, it would be highly desirable if the accumulation potential could be lowered to less than −5 volts. The imager vertical clocks could then be operated by the same power supplies employed for the video amplifier operation, the −15 volt supply could be eliminated, and the power consumption of the camera could be reduced.

SUMMARY OF THE INVENTION

In accordance with the invention, a full frame solid-state image sensor of altered accumulation potential comprises a substrate that includes a semiconductor of one conductivity type and has a surface at which is situated a photodetector that comprises a first storage area and a second storage area. The first and second storage areas each comprise a CCD channel of conductivity type opposite to the conductivity type of the semiconductor. A first barrier region separates the first storage area from the second storage area, and a second barrier region separates the second storage area from an adjacent photodetector; the second barrier region is shallower than the first barrier region. Adjacent to one side of the photodetector is a channel stop of the same conductivity type as the semiconductor. A first gate and a second gate each comprising a conductive layer overlie the CCD channel, and positioned between the channel and the conductive layer is an O—N—O dielectric that comprises a first silicon dioxide layer and a second silicon dioxide layer and a silicon nitride layer interposed between the silicon dioxide layers. The silicon nitride layer comprises a trapped electric charge sufficient to alter the accumulation potential by 3 to 4 volts; the trapped electric charge is injected into the silicon nitride layer by applying a stress potential to the first and second gates.

Further in accordance with the invention, a method for forming a full frame solid-state image sensor of altered accumulation potential comprises doping a substrate having a surface with a first dopant to form a semiconductor of one conductivity type and doping a portion in the surface of the substrate with a second dopant to form a CCD channel of conductivity type opposite to the semiconductor. For a given gate dielectric, the accumulation potential of the CCD channel is determined by the difference in concentration of the first and second dopants. An O—N—O dielectric comprising a first and a second silicon dioxide layer and a silicon nitride layer interposed between the silicon dioxide layers is formed on the CCD channel, and a first and a second gate each comprising a conductive layer is formed on the dielectric. Applying of a stress potential to the gates produces in the silicon nitride layer a trapped electric charge sufficient to alter the accumulation potential by 3 to 4 volts. Also in accordance with the invention, the silicon nitride layer may be heated simultaneously with the application of the stress potential to the gates.

ADVANTAGEOUS EFFECT OF THE INVENTION

The present invention provides for the altering of the accumulation potential in a full frame image sensor to about −4 volts, thereby enabling the construction of a camera system that utilizes +5 and −5 volt power supplies to operate both the vertical clocks and the video amplifier.

DETAILED DESCRIPTION OF THE INVENTION

Figure 1:
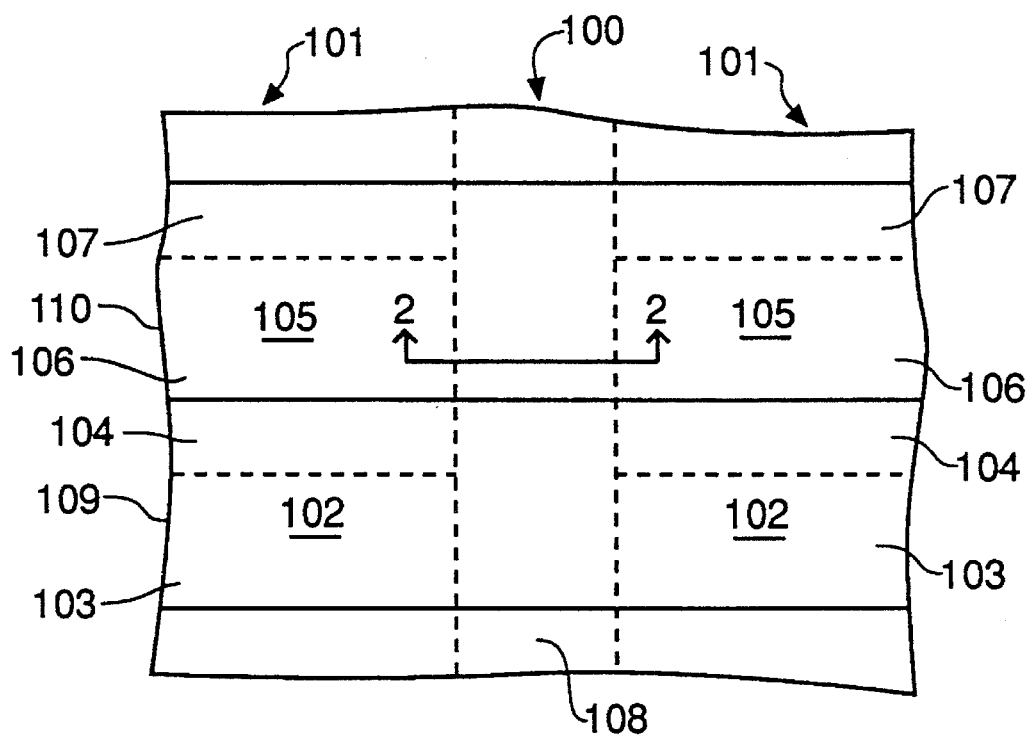
FIG. 1 is a top plan view of a portion of a solid-state image sensor of the present invention.
Figure 2:
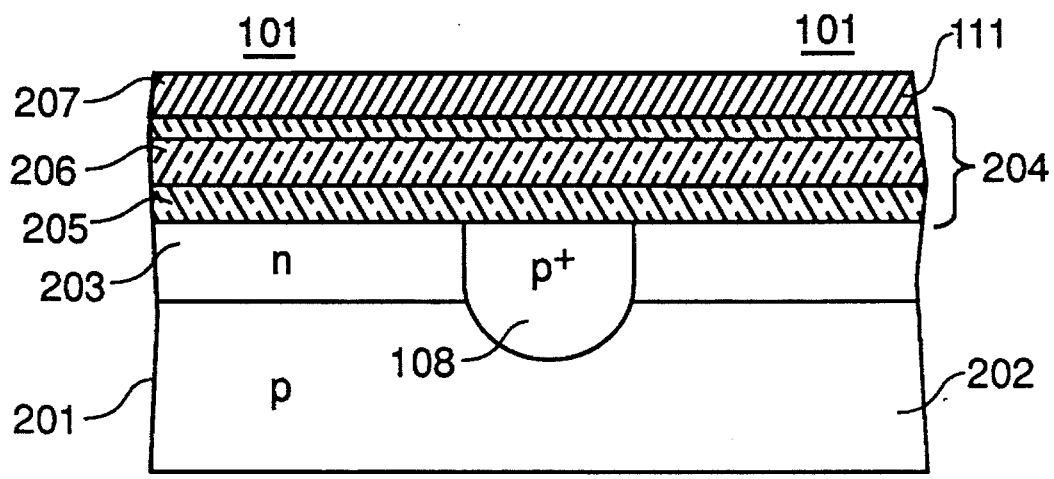
FIG. 2 is a sectional view along line 2—2 in FIG. 1 of a portion of an image sensor of the invention.

Referring to FIGS. 1 and 2, there is shown a schematic representation of a solid-state image sensor 100 that is an embodiment of the present invention. The image sensor 100 can comprise any number of CCD photodetectors 101, which are arranged in a spaced parallel relation. Each photodetector, or pixel, comprises two phases, a first pixel phase 102, which includes a first storage area 103 and a first barrier 104, and a second pixel phase 105, which includes a second storage area 106 and a second barrier 107. The barrier 107, which separates the second storage area of the pixel from the first phase of an adjacent pixel, is shallower than the barrier 104, which lies between the first and second storage areas of the pixel. A channel stop 108 adjacent to both phases of the pixel extends the length of the pixel.

A first set of parallel conductive gates 109, spaced apart over the first pixel phase 102 of the CCD channels 203, extends laterally across the CCD channels of all the photodetectors 101. A second set of parallel conductive gates 110, each of which is positioned between two of the first set of gates 109, also extends laterally across the CCD channels 203 of all the photodetectors 101 and are positioned over the second pixel phase 105 of the channels. These gates may be formed of a layer of conductive transparent material such as indium tin oxide or doped polycrystalline silicon.

Each photodetector 101 of image sensor 100 comprises a substrate 201 whose bulk portion comprises a semiconductor 202 of one conductivity type, shown in FIG. 2 as p-type. The semiconductor material may be, for example, single-crystalline silicon. The p-type substrate is doped with boron at a concentration of about $0.5–2.5 \times 10^{15}$ impurities/cm$^3$. At one surface of the substrate 202 and included within both storage areas of each pixel is a CCD channel 203 of conductivity type, in this case n-type, opposite to the conductivity type of the semiconductor. The n-type CCD channel may be formed by ion implantation of dopant impurities such as arsenic into the surface of the substrate at a surface concentration of about $10^{17}$ impurities/cm$^3$.

Interposed between the CCD channels 203 and both sets of conductive gates 110 and 111 is a dielectric 204, in particular, an O—N—O dielectric, which comprises a first silicon dioxide layer 205 adjacent to the CCD channel 203, a second silicon dioxide layer 207 adjacent to the sets of conductive gates 110 and 111, and a silicon nitride layer 206 situated between the first and second silicon dioxide layers. The first silicon dioxide layer 205 has a thickness of at least 100 angstroms, preferably about 250 angstroms. The thickness of the second silicon dioxide layer 207 is about 50 to 200 angstroms, preferably about 120 angstroms. The silicon nitride layer has a thickness of at least 100 angstroms, preferably about 300 angstroms.

The channel stop 108 is highly conductive and of the same conductivity type as the semiconductor 202; the conductivity of the channel stop, which extends from the substrate surface through the CCD channel 203 and into the p-type semiconductor is represented as p$^+$ in FIG. 2.

Methods for making CCD photodetectors are described in U.S. Pat. No. 4,613,402, the disclosures of which are incorporated herein by reference. In accordance with the present invention, the image sensors may include antiblooming structures, as described in U.S. Pat. Nos. 4,975,777, 5,130, 774, and 5,349,215, the disclosures of which are incorporated herein by reference.

Radiation from an image is detected by a photodetector and converted to charge carriers in both pixel phases while a potential, typically about −8 volts in the prior art, is applied to both gate 109 and gate 110. Then, while the voltage of gate 110 remains at −8 volts, a positive voltage, typically about +0.5 volt, is applied to gate 109. The resulting increase in channel potential causes charge carriers in phase 2 to flow into phase 1 and add to the charge already present there. Then the voltages at both gates are reversed; −8 volts is applied to gate 109, +0.5 volt to gate 110. This causes the charge accumulated in phase 1 to be transferred to phase 2 of the next pixel. A voltage of −8 volts is subsequently applied to gate 110, and the process is repeated. By clocking the voltages back and forth between the two sets of gates sequentially in this manner, the charge carriers are moved along the pixels to an output circuit, not shown, at the end of the sensor.

As previously discussed, because the minimum gate voltage typically required in the prior art to cause majority carrier accumulation at the Si/SiO$_2$ interface of the pixel storage areas is about −6.5 to −7.5 volts, a vertical clock voltage of −8 volts is generally applied to the gates in the operation of the sensor. In accordance with the invention, after fabrication and prior to use a stress voltage is applied on the gates of the sensor, resulting in sufficient lowering, by 3–4 volts, of the accumulation potential, which allows the use of a power supply of lower voltage. Also in accordance with the invention, the sensor may be subjected to elevated temperature simultaneously with the application of the stress voltage.

Figure 3:
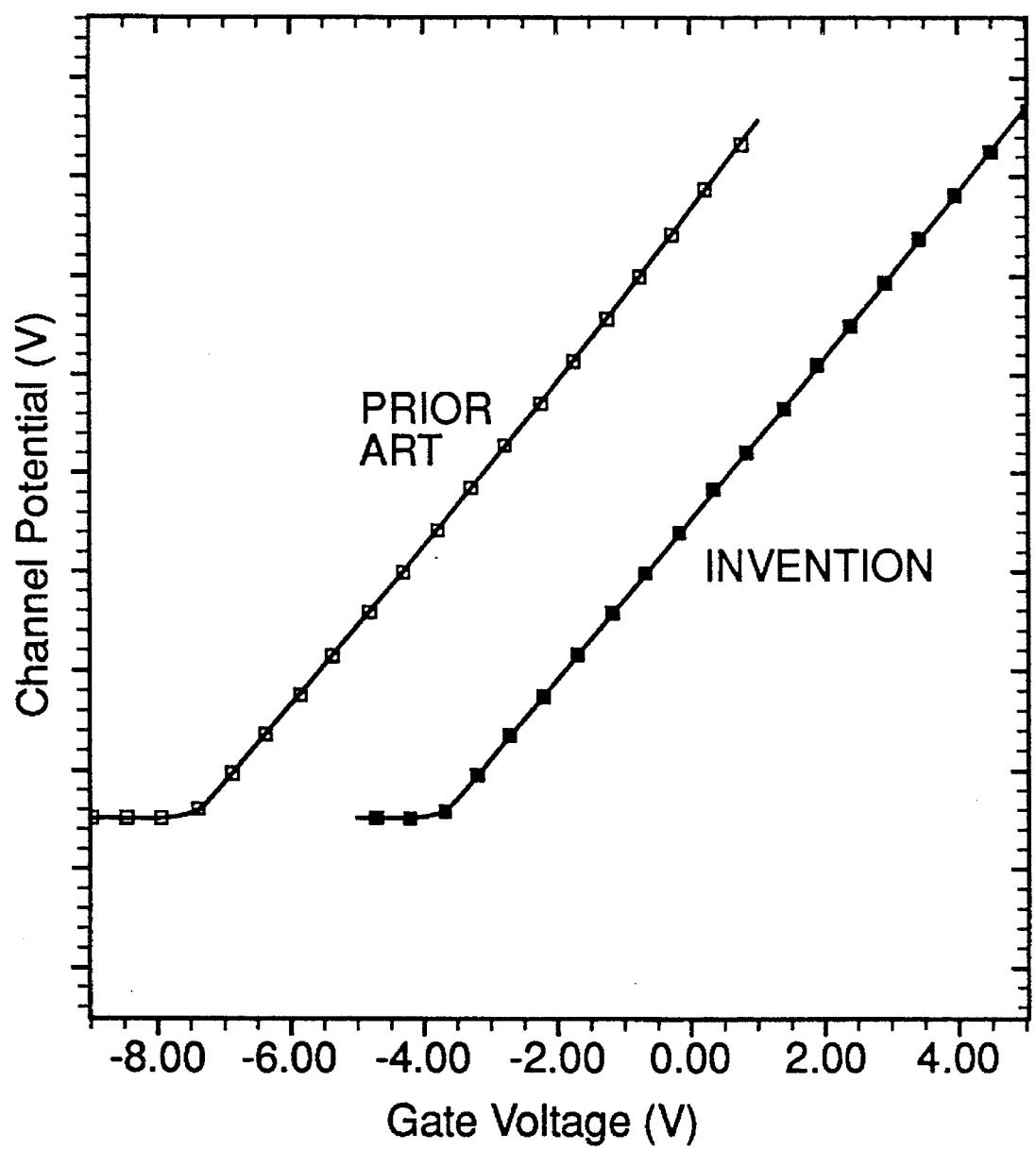
FIG. 3 is a plot of channel potential versus applied gate voltage.

FIG. 3 is a plot of channel potential versus applied gate voltage for a typical sensor formed in accordance with the prior art compared with a sensor formed by the method of the present invention. The accumulation potential, that value of the gate voltage at which the channel potential becomes invariant with increased gate voltage, is represented by the points at which each of the curves in FIG. 3 become flat. As shown in FIG. 3, the plot for the sensor treated by the method of the present invention shows a value for the accumulation potential of about −4.0 volts, compared to a corresponding value of about −7.5 volts for the prior art sensor. In effect, the plot of channel potential versus applied gate voltage has been laterally displaced by about 3.5 volts in the positive direction by application of the present invention.

The lowering of the accumulation potential in accordance with the method of the invention is the result of electron injection into the silicon nitride layer of the dielectric by applying a high stress voltage to the gates of the sensor. In one example of the invention, a stress voltage of −40 volts was applied for 10 seconds at 25° C. to a sensor with an O—N—O dielectric comprising a 250 angstrom-thick first silicon dioxide layer, a 300 angstrom-thick silicon nitride layer, and a 100 angstrom-thick second silicon dioxide layer; a −3 volt shift in the accumulation potential was thereby accomplished.

To increase the rate of election injection into the silicon nitride layer, the device can be heated at a temperature up to about 250° C. for a time period of 1 second to 2 minutes simultaneously with application of the stress voltage. Heating the device may be accomplished with a TP 0412A Thermo Stream® System, available from Temptronic Corp., Newton Mass.

The shift in accumulation potential can be controlled by the thickness of the silicon nitride layer in the dielectric. The formation of O—N—O dielectrics is described in, for example, Pan et al., IEEE Transaction of Electron Devices, 1990, Vol. 37, pp. 1439–1443, the disclosures of which are incorporated herein by reference. The thicknesses of the layers of the dielectric may be as follows: for the first silicon dioxide layer, at least 100 angstroms, preferably about 250 angstroms; for the second silicon dioxide layer about 50 to 200 angstroms, preferably about 120 angstroms; and for the silicon nitride layer about 100 to 400 angstroms, preferably about 300 angstroms.

The accumulation potential shift may also be controlled by: the magnitude of the stress potential, about −5 to −50 volts, preferably about −10 to −40 volts; the temperature of heating, up to about 250° C., preferably up to about 80° C.; and the time period for heating and applying the stress potential, about 1 second to 2 minutes, preferably about 10 seconds to 1 minute.

The invention has been described in detail with particular reference to certain preferred embodiments thereof, but it will be understood that variations and modifications can be effected within the spirit and scope of the invention.

PARTS LIST

| PARTS LIST | |
| --- | --- |
| 100 image sensor | 110 second conductive gate |
| 101 photodetector | 201 substrate |
| 102 first pixel phase | 202 semiconductor |
| 103 first storage area | 203 CCD channel |
| 104 first barrier region | 204 dielectric |
| 105 second pixel phase | 205 first silicon dioxide layer |
| 106 second storage area | 206 silicon nitride layer |
| 107 second barrier region | 207 second silicon dioxide layer |
| 108 channel stop | |
| 109 first conductive gate | |

What is claimed is:

1. A full frame solid-state image sensor of altered accumulation potential, which comprises:
   (a) a substrate comprising a semiconductor of one conductivity type and having a surface;
   (b) at least one photodetector at said surface of said substrate, said photodetector comprising a first storage area and a second storage area, said first storage area and said second storage area each comprising a CCD channel of conductivity type opposite to the conductivity type of said semiconductor;
   (c) a first barrier region between said first storage area and said second storage area;
   (d) a second barrier region between said second storage area and an adjacent photodetector wherein said second barrier region is shallower than said first barrier region;
   (e) a channel stop of the same conductivity type as said semiconductor adjacent to one side of said photodetector;
   (f) a first gate and a second gate each comprising a conductive layer overlying said CCD channel; and
   (g) interposed between said CCD channel and said conductive layer, an O—N—O dielectric comprising a first silicon dioxide layer, a second silicon dioxide layer, and a silicon nitride layer interposed between said first and second silicon dioxide layers; wherein said silicon nitride layer comprises a trapped electric charge sufficient to alter said accumulation potential by 3 to 4 volts, said trapped electric charge being injected into said silicon nitride layer by applying a stress potential to said first and second gates.

2. An image sensor of claim 1 wherein said dielectric comprises a first silicon dioxide layer having a thickness of about 100 to 300 angstroms adjacent to said CCD channel, a second silicon dioxide layer having a thickness of about 50 to 200 angstroms adjacent to said conductive layer, and a silicon nitride layer having a thickness of about 100 to 400 angstroms interposed between said first and second silicon dioxide layers.

3. An image sensor of claim 2 wherein said first silicon dioxide layer has a thickness of about 250 angstroms, said second silicon dioxide layer has a thickness of about 120 angstroms, and said silicon nitride layer has a thickness of about 300 angstroms.

4. An image sensor of claim 1 wherein said CCD channel is of negative conductivity type and said applying of said stress potential to said gates is at a voltage of about −5 volts to −50 volts.

5. An image sensor of claim 4 wherein said applying of said stress potential is at a voltage of about −10 volts to −40 volts.

6. An image sensor of claim 4 wherein said applying of said stress potential is for a time period of 1 second to 2 minutes.

7. An image sensor of claim 6 wherein said time period is 10 seconds to 1 minute.

8. An image sensor of claim 1 wherein said semiconductor comprises a p-type dopant and said CCD channel comprises an n-type dopant.

9. An image sensor of claim 8 wherein said semiconductor comprises boron-implanted silicon and said CCD channel comprises arsenic-implanted silicon.

10. An image sensor of claim 9 wherein said applying of said stress potential to said gates is at a voltage of about −10 volts to −40 volts for a time period of 10 seconds to 1 minute.

11. An image sensor of claim 10 wherein said accumulation potential is about −4 volts.

* * * * *